United States Patent [19]
Belcher et al.

[11] Patent Number: 6,080,987
[45] Date of Patent: Jun. 27, 2000

[54] INFRARED-SENSITIVE CONDUCTIVE-POLYMER COATING

[75] Inventors: James F. Belcher, Plano; Stephen L. Whicker, Dallas, both of Tex.

[73] Assignee: Raytheon Company, Lexington, Mass.

[21] Appl. No.: 08/958,955

[22] Filed: Oct. 28, 1997

Related U.S. Application Data

[60] Provisional application No. 60/031,223, Nov. 22, 1996.

[51] Int. Cl.$^7$ .............................. G01J 5/08; H01L 27/146
[52] U.S. Cl. ....................................... 250/332; 250/338.3
[58] Field of Search .................................. 250/332, 338.3

[56] References Cited

U.S. PATENT DOCUMENTS

| | | |
|---|---|---|
| 3,301,707 | 1/1967 | Loeb et al. . |
| 3,359,192 | 12/1967 | Heinrich et al. . |
| 4,048,349 | 9/1977 | White et al. . |
| 4,080,532 | 3/1978 | Hopper . |
| 4,139,444 | 2/1979 | Singer et al. . |
| 4,662,984 | 5/1987 | Ohtake et al. . |
| 4,678,536 | 7/1987 | Murayama et al. . |
| 4,705,593 | 11/1987 | Haigh et al. . |
| 4,740,700 | 4/1988 | Shaham et al. . |
| 4,745,278 | 5/1988 | Hanson . |
| 4,792,681 | 12/1988 | Hanson . |
| 4,871,416 | 10/1989 | Fukada . |
| 4,926,051 | 5/1990 | Turnbull . |
| 4,927,771 | 5/1990 | Ferrett . |
| 5,030,827 | 7/1991 | Powell . |
| 5,115,442 | 5/1992 | Lee et al. . |
| 5,183,531 | 2/1993 | Terakado . |
| 5,238,529 | 8/1993 | Douglas . |
| 5,279,702 | 1/1994 | Douglas . |
| 5,312,516 | 5/1994 | Douglas et al. . |
| 5,374,330 | 12/1994 | Douglas . |
| 5,424,544 | 6/1995 | Shelton et al. . |
| 5,426,304 | 6/1995 | Belcher et al. . |
| 5,436,450 | 7/1995 | Belcher et al. . |
| 5,460,687 | 10/1995 | Douglas . |
| 5,466,331 | 11/1995 | Belcher . |
| 5,466,332 | 11/1995 | Owen et al. . |
| 5,532,484 | 7/1996 | Sweetser et al. ................... 250/332 |
| 5,574,282 | 11/1996 | Walker et al. ..................... 250/338.3 |
| 5,602,392 | 2/1997 | Owen et al. ....................... 250/338.3 |
| 5,603,848 | 2/1997 | Beratan et al. . |
| 5,608,254 | 3/1997 | Frank et al. . |
| 5,638,599 | 6/1997 | Beratan et al. . |
| 5,653,892 | 8/1997 | Belcher et al. . |
| 5,679,267 | 10/1997 | Belcher et al. . |

FOREIGN PATENT DOCUMENTS

| 1072049 | 6/1967 | United Kingdom . |
|---|---|---|

OTHER PUBLICATIONS

Bunshah et al, "Deposition Technologies for Films and Coatings", Noyes Publications, Park Ridge, New Jersey, title pages and pp. 102–104, 1982 (no month).

D. J. Warner, D. J. Pedder, I. S. Moody, and J. Burrage, "The Preparation and Performance of Reticulated Targets for the Pyroelectric Vidicon", *Ferroelectrics*, 33, 1981, pp. 249–253, (no month).

(List continued on next page.)

*Primary Examiner*—Constantine Hannaher
*Attorney, Agent, or Firm*—Baker Botts L.L.P.

[57] ABSTRACT

This is a novel conductive-polymer optical coating for infrared detection and method of making the same. The system may comprise an integrated circuit substrate itself comprising a plurality of mesas and comprising via connections on an upper portion of each of the mesas. The system further comprises a plurality of backside electrical contacts bonded to the via connections, a plurality of infrared-sensitive pixels overlying the electrical contacts, and a conductive-polymer optical coating overlying and electrically connecting the pixels. A method of forming an embodiment of the present invention may comprise forming a conductive-polymer optical coating over a substrate, forming a contact metal on a backside of the substrate, and processing the contact metal, the substrate and the common electrode to form capacitor pixels of the contact metal, the substrate and the corresponding portion of the optical coating.

25 Claims, 4 Drawing Sheets

OTHER PUBLICATIONS

R. Watton, F. Ainger, S. Porter, D. Pedder and J. Gooding, "Technologies and Performance for Linear and Two Dimensional Pyroelectric Arrays", SPIE vol. 510, Infrared Technology X, 1984, pp. 139–148, (no month).

T.D. Flaim, G. A. Barner, and T. Brewer, "A Novel Release Layer System for IC Processing", Brewer Science, Inc. Rolla, Missouri, presented at KTI IF Conference, Nov. 1989.

C. Hanson, H. Beratan, R. Owen and K. Sweetser, "Low-Cost Uncooled Focal Plane Array Technology", Texas Instruments Incorporated, DSEG, presented at IRIS Speciality Group on Infrared Detectors, Bedford, MA. Jul. 14, 1993.

C. Hanson, "Uncooled Thermal Imaging at Texas Instruments", SPIE 1993, International Symposium on Optics, Imaging and Instrumentation, Infrared Technology XIX, San Diego, Jul. 14, 1993.

H. Kaufman, R. Robinson, W. Hughes, "Characteristics, Capabilities and Applications of Broad–Beam Sources", Commonwealth Scientific Corporation, Alexandria, Virginia, 1987, (no month).

R. Watton, "Ferroelectrics for Infrared Detection and Imaging", ISAF '86, Proceedings of the Sixth IEEE International Symposium on Applications of Ferroelectrics, Jun. 1986.

Suhr, et al., "Plasma–Deposited Metal–Containing Polymer Films", Plasma Chemistry and Plasma Processing, vol. 8, No. 1, pp. 9–17, 1988 (no month).

H. Suhr, A. Etspüler, E. Feurer, and C. Oehr, "Plasma–Deposited Metal–Containing Polymer Films", Plasma Chemistry and Plasma Processing, vol. 8, No. 1, 1988, pp. 9–17.

L. Martinu and H. Beiderman, "Monitoring the Deposition Process of Metal–Doped Polymer Films Using Optical Emission Spectroscopy", Plasma Chemistry and Plasma Processing, 1985, pp. 81–87.

INFRARED-SENSITIVE CONDUCTIVE-POLYMER COATING

CROSS REFERENCE TO RELATED APPLICATIONS

This application claims priority under 35 U.S.C. § 119(e)(1) of provisional application number 60/031,223, filed Nov. 22, 1996.

The following applications and patents are related to the present application: U.S. Pat. No. 5,679,267, entitled "Dual Etching of Ceramic Materials With an Elevated Thin Film"; U.S. Pat. No. 5,847,390, entitled "Reduced Stress Electrode for Focal Plane Array of Thermal Imaging System and Method"; and copending U.S. Ser. No. 08/958,918, entitled "System and Method for Making a Conductive-Polymer Coating," filed Oct. 28, 1997.

FIELD OF THE INVENTION

This invention generally relates to a conductive-polymer coating for infrared (IR) radiation absorption, and a method and apparatus for making the same.

BACKGROUND OF INVENTION

IR detector arrays are described in (1) U.S. Pat. No. 4,080,532, Hopper, March 1978; (2) U.S. Pat. No. 4,745,278, Hanson, May 1988; (3) U.S. Pat. No. 4,792,681, Hanson, December 1988; and (4) "LOW-COST UNCOOLED FOCAL PLANE ARRAY TECHNOLOGY", by Hanson, Beratan, Owen and Sweetser; presented Aug. 17, 1993 at the IRIS Detector Specialty Review. Various manufacturing and fabrication techniques for several different IR sensing array systems are described in these references.

The physical requirements of uncooled IR arrays and a brief description of current fabrication processes will be presented to aid in the understanding of the improvements realized by the novel methods to be described.

A line scanner may contain from several hundred to a few thousand individual picture elements (pixels); an area imager may contain several thousand to tens of thousand individual pixels. Each of these pixels typically consists of a capacitor (or resistor or another type of electronic element) that has a heat sensitive dielectric, i.e., sensitivity to IR intensity. Making use of the fact that the charge stored by a capacitor is proportional to the product of its terminal voltage and its capacitance electronic circuitry can be attached to the two terminals of the pixel capacitor to mlecasure the intensity of the IR impinging on a specific pixel. Obstructions in the imaging field are removed and the electrical connections to these capacitors are simplified if one of the capacitor terminals is made common to all. Hundreds to tens of thousands of electrical connections must still be accomplished between the other isolated terminals of the pixel capacitors and the electronic sensing circuitry. In addition, the pixel capacitors must be thermally isolated from each other, even while having one terminal connected to all the other common terminals.

The common side of the pixels is referred to as the optical coating and generally must (1) efficiently absorb IR energy at the desired wavelengths, (2) provide a continuous electrical path to supply a bias voltage to all pixels and (3) attach to or form an electrode for each of the pixel capacitors. The optical coating is typically a composite of a plurality of thin films having the desired physical properties, such as IR absorbability, electrical conductivity, thermal isolation, etc. The optical coating side of the device will be referred to as the frontside, and the opposite side will be referred to as the backside.

The thicker heat sensitive dielectric forms the array substrate and is typically a pyroelectric or ferroelectric ceramic material such as barium-strontiumn-titanate (BST).

SUMMARY OF THE INVENTION

As described in the prior references and subsequently here, typical optical coatings consist of a plurality of films of specific insulating and conducting properties at critical thicknesses. These films generally require several different processes and equipment to manufacture. Structurally, these composite films are typically mechanically brittle and fragile.

A preferred embodiment of this invention replaces the fragile prior art optical coating with a semi-flexible, robust conducting-polymer coating, which has been discovered to generally have high—greater than 90%—IR absorption at the desired wavelengths. In addition, this coating can be deposited by a single, novel apparatus, which will also be described. Although electrically conducting polymers are not new (see W. E. Loeb, U.S. Pat. No. 3,301,707, issued Jan. 31, 1967), the present invention is believed to be the first to use an electrically conducting polymer as an optical coating for IR absorption, and in particular as a physically robust optical coating providing IR absorption, electical conductivity and limited thernal conductivity.

One embodiment of the present invention is a conductive-polymer coating for an infrared detection system. The system may comprise an integrated circuit substrate itself comprising a plurality of mesas and comprising via connections on an upper portion of each of the mesas. The system further comprises a plurality of backside electrical contacts bonded to the via connections, a plurality of infrared-sensitive pixels overlying the electrical contacts, and a conductive-polymer coating overlying and electrically connecting the pixels.

A method of forming an embodiment of the present invention may comprise forming a conductive-polymer coating over a substrate, forming a contact metal on a backside of the substrate, and processing the contact metal, the substrate and the common electrode to form capacitor pixels of the contact metal, the substrate and the corresponding portion of the coating.

The forming of a conducting polymer may include codepositing an electrically insulating organic polymer and a low-melting-point electrical conductor. The insulating organic polymer may consist of, for example, one of the various compositions from the generic parylene family, including: poly(p-xylylene), poly-(chloro-p-xylylene), 2-methyl-p-xylylene, 2-ethyl-p-xylylene, 2-chloro-p-xylylene, 2-acetyl-p-xylylene, 2-cyano-p-xylylene, 2-bromo-p-xylylene, and dichloro-p-xylylene. As used herein, the term "low-melting-point," when used in reference to the electrically conducting component of the conducting polymer, means a temperature of less than 1000° C. The low-melting-point electrical conductor may be a metal or a semiconductor material, and generally has a melting point of less than about 1000° C., typically less than about 700° C., preferably less than about 600° C., more preferably less than about 500° C., and most preferably less than about 400° C. It may consist of, for example, lead, tin, indium, cadmium, bismuth, antimony, magnesium, lithium, europium, strontium, selenium, samarium, polonium, zinc, and thallium or other metals or semiconductors or compositions with a low melting temperature. In addition, an elevation layer may be formed between the common electrode and the conductive-polymer. The individual pixels may be formed by ion milling, reactive ion milling, chemical etching, laser vaporization or other equivalent methods.

Another embodiment of the present invention is an apparatus for forming a conductive-polymer coating for an infrared detection system. The apparatus may comprise an upper vacuum chamber, a shutter assembly mounted inside the upper vacuum chamber, a substrate holder disposed inside the shutter to the assembly. wherein the shutter assembly is cipable of shielding or exposing the substate to the upper vacuum chamber, an orifice connected to the upper vacuum chamber for control of a flow rate for the upper vacuum chamnber, a first mechanical pump system connected to the orifice, a lower vacuum chamber connected to the upper vacuum chamber on a side opposite the shutter assembly, an electron beam assembly for providing the low-melting-point electrical conductor in vapor form, disposed inside the lower vacuum chamber, wherein the electron beam assembly is directed toward the shutter assembly in the upper vacuum chamber, a second mechanical pump system and a cryopump connected to the lower vacuum chamber, a polymer generation chamber for providing polymer vapor, connected to the upper vacuum chamber on a side perpendicular to the shutter assembly, a vaporizer surrounding a first portion of the polymer generation chamber, a pyrolysis furnace surrounding a second portion of the polymer generation chamber, and a post pyrolysis heater surrounding a third portion of the polymer generation chamber.

Another embodiment of the present invention is a method of manufacture for forming a conductive-polymer on a substrate. The method may comprise generating a low-melting-point electrical conductor in vapor form, generating a polymer vapor with a pyrolysis furnace, mixing the conductor vapor and the polymer vapor in a first vacuum chamber, and exposing the substrate to the vapors to allow deposition of the vapors on the substrate through, e.g., condensation.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

This invention will be described with the aid of FIGS. 1 to 6 and Tables 1 and 2. The figures show exaggerated thin film layer thicknesses for descriptive purposes and are not to actual or relative scale. Although specific IR sensor designs have been sketched in the figures, this invention is generic to all such arrays using an IR absorbing optical coating.

Figure 1:
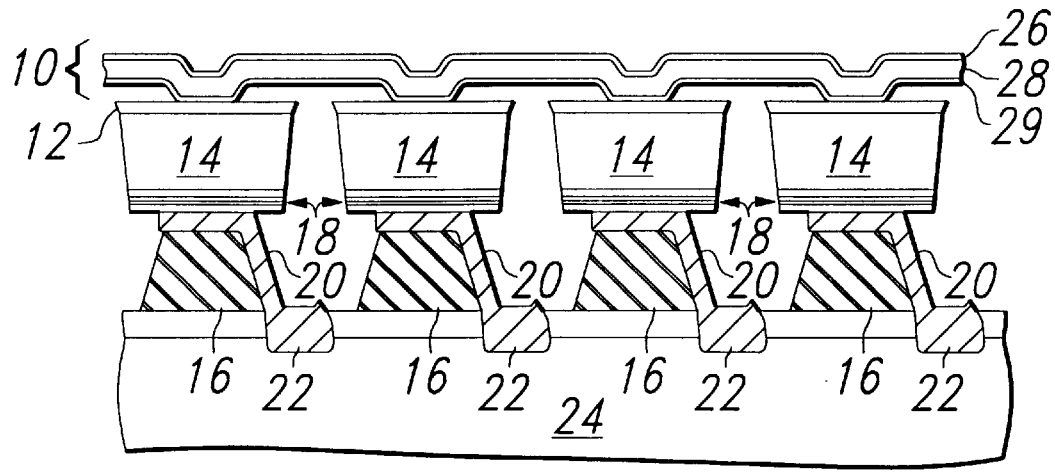
FIG. 1 illustrates a vertical cross section of a prior art IR sensing array with an elevated optical coating.

FIG. 1 shows a cross section of a prior art IR sensing array system which consists of a sensing array and a signal processing IC 24. The impinging IR radiation is absorbed by the optical coating 10 composed of layers 26, 28 and 29 as described in Table 1. This coating is electrically and mechanically connected to metal 12 which forms the top electrode of the pixel capacitor and is electrically common to all other pixels via layer 29. The thermally sensitive dielectric material 14 of the pixel capacitor is typically BST. The backside of the pixel capacitor is metal 18 which is electrically and thermally isolated from all other pixels. The pixel capacitors are supported by mesas 16, which also provide metal via connections 20 provide electrical connection to substrate 24 at 22.

Figure 2:
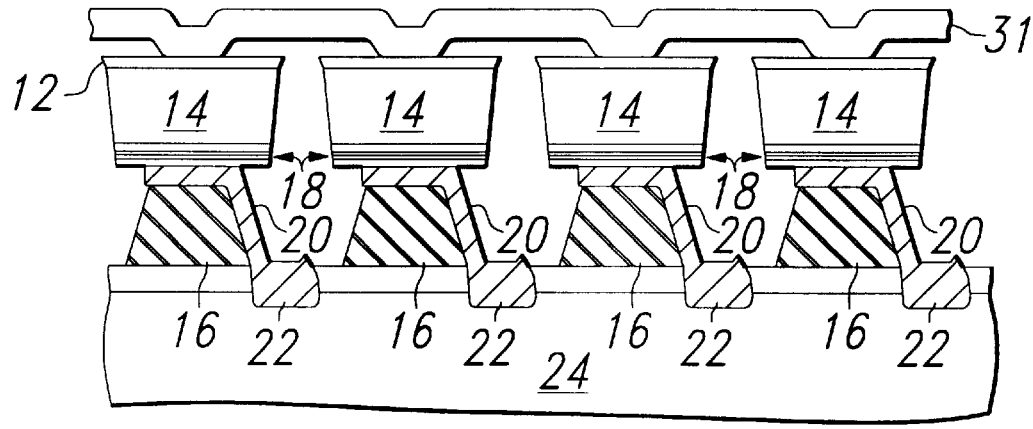
FIG. 2 illustrates a vertical cross section of a novel IR sensing array utilizing an elevated conductive-polymer optical coating.

FIG. 2 shows the same type of device with basically the same general functionality as that just described above with reference to FIG. 1, except that elevated conductive-polymer optical coating 31 is substituted for optical coating 10. The conducting polymer is formed by codeposition of an insulating organic polymer and a low-melting-point electrical conductor. The novel method of deposition of film 31 is described in more detail below. The functions of the three layers in the prior art optical coating are replaced by a single conductive-polymer optical caoting layer which provides IR absorption electrical connectivity and thermal isolation for the pixel capacitors. In additioin, the conductive-polymer is mechanically more robust than the materials used in the prior art.

TABLE 1

| ID # | Description | Material (dim) | Alternates |
|---|---|---|---|
| 10 | Optical coating | 3 layered | 1/4 IR wavelength |
| 12 | Conducting electrode | NiCr | TiW |
| 14 | Thermally sensitive substrate | Barium strontium titanate | Other infrared-sensitive pyroelectric or ferroelectric materials, or perovskites. |
| 16 | Isolation mesas | Polyimide | PMMA, photoresist |
| 18 | Backside electrical contact | 4-layer composite of 15–60 μm In 0.5–1.5 μm Au 0.5–1.5 μm NiCr 0.2–1.0 μm TiW | Multiple alloys or layers suitable for IC bonding, such as Ni/In. |
| 20 | Metal via connection | TiW | |
| 22 | Via connection to substrate | | |
| 24 | Signal processing IC | Si or GaAs | |
| 26 | Transparent coat | NiCr 50A | NiCr 25–100A |
| 28 | 1/4 wavelength separator coat | Parylene 1.4 μm | 1/4 wavelength at desired IR |
| 29 | Electrical conducting coat | NiCr 1000A | NiCr 500–2000A Bimetal layer 20A - 5 μm Other metals |
| 30 | Common electrode | NiCr 1000A | NiCr 500–2000A Bimetal layer 20A - 5 μm Other metals |
| 31 | Elevated conductive polymer optical coating | Parylene and lead | Different combinations of parylene and lead, tin, indium, cadmium, bismuth, |

TABLE 1-continued

| ID # | Description | Material (dim) | Alternates |
|---|---|---|---|
|  | (combination of an insulating organic polymer and a low-melting-point electrical conductor) |  | antimony, magnesium, lithium, europium, strontium, selenium, samarium, polonium, zinc, thallium, tellurium, germanium telluride, cadmium telluride, cadmium tin, cadmium zinc, germanium, or other metals or semiconductors or compositions with a low melting temperature. |
| 32 | Planar conductive-polymer optical coating | Parylene and lead | Same as drawing element 31 above. |
| 78 | Conductive-polymer coating | Parylene and lead | Same as drawing element 31 above. |
| 80 | IR sensitive material | Barium strontium titanate | Materials from drawing element 14 above. For example, (Ba, Sr, Ca, Pb)(Ti, Zr)O$_3$, (Pb, La)(Zr, Ti)O$_3$, bismuth tanate, potassium tantalate, lead scandium tantalate, lead niobate, potassium niobate, lead zinc niobate, lead magnesium niobate, tantalum pentoxide, yttrium oxide. Donor, acceptor, or donor and acceptor doped oxides listed above or combinations of the above materials |

Figure 3:
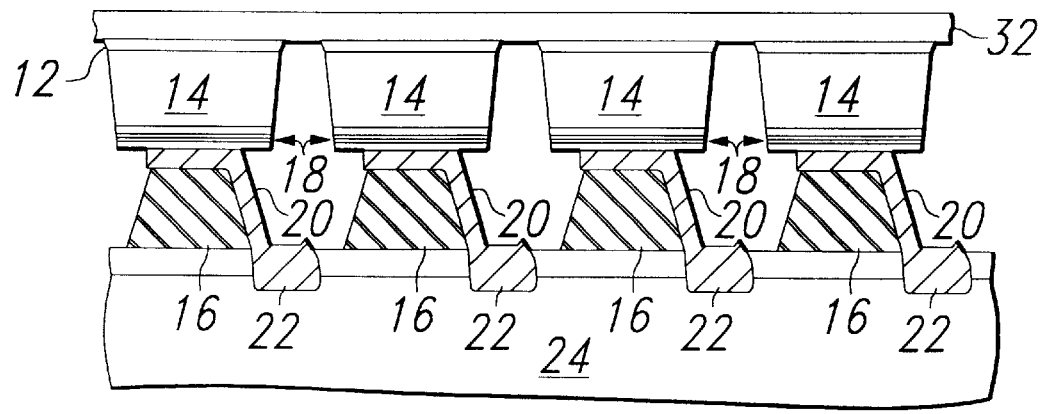
FIG. 3 shows a vertical cross section of a novel IR sensing array utilizing a planar conductive-polymer optical coating with conductive electrodes on each pixel.

FIG. 3 shows an alternate embodiment, an IR sensing hybrid having basically the same general functionality as those described with reference to FIG. 2, but the planar conductive-polymer optical coating 32 is not elevated as in the previous figures. As is described more fully in the referenced prior art, the planar optical coating typically is easier to manufacture, but may provide less thermal isolation between pixels.

Figure 4:
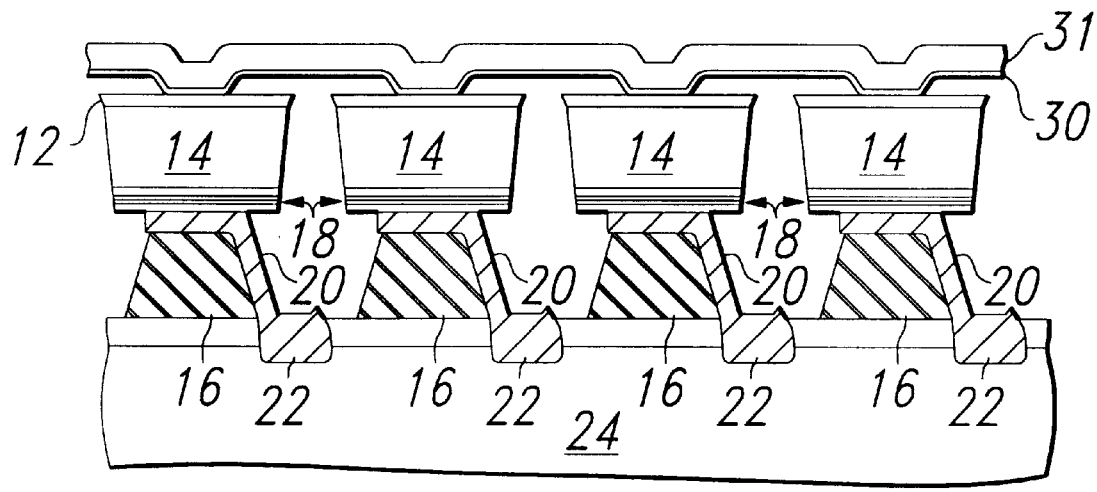
FIG. 4 illustrates a vertical cross section of a novel IR sensing array utilizing an elevated conductive-polymer optical coating with a common electrode layer.

FIG. 4 shows another alternate embodiment, an IR sensing hybrid to that described with reference to FIG. 2, except that the elevated coating consists of conductive-polymer 31 overlying NiCr layer 30. In this embodiment NiCr layer 30 functions as the common electrode connection between the pixels, allowing conductive-polymer 31 to contain less metal than the embodiment in FIG. 2 because less conductivity is required of conductive-polymer 31.

Alternatively, NiCr layer 30 may be replaced with a bimetal layer of, for example, NiCr and TiW, as described in Long et al., "Reduced Stress Electrode for Focal Plane Array of Thermal Imaging System and Method", U.S. Pat. No. 5,847,390. Alternatively, a compressive bimetal layer can provide for reduced stress on the IR sensing array it one layer is made of tensile material and the other layer is male of compressive material.

Figure 5:
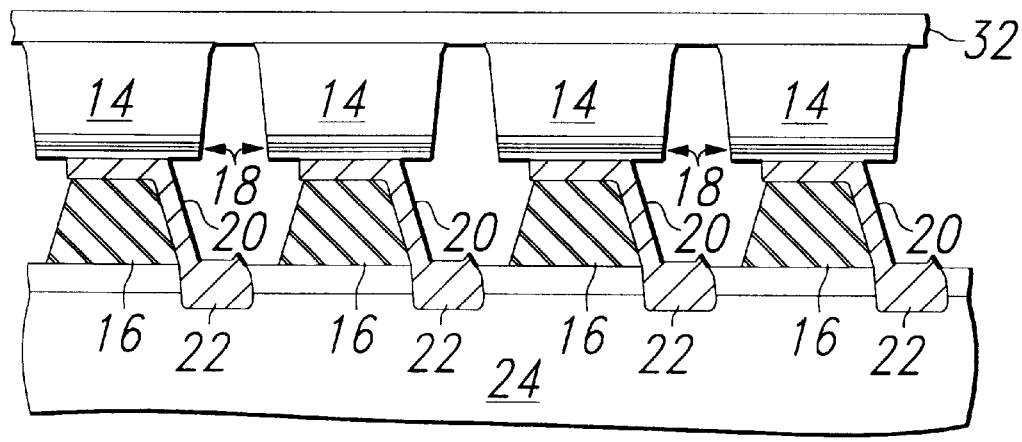
FIG. 5 shows a vertical cross section of a novel IR sensing array utilizing a planar conductive-polymer optical coating without the conductive electrodes on each pixel.

FIG. 5 shows yet another alternate emnbodiment, an IR sensing hybrid similar to that described with reference to FIG. 3, but without conducting electrodes 12 between capacitor dielectric 14 and conductive-polymer optical coating 32. In one alternative of this embodiment, conductive-polymer 32 is manufactured to have a high concentration of conductive material near capacitor dielectric 14 to provide a good electrical connection to capacitor dielectric 14; and the concentration of conductive material in coating 12 decreases upward through layer 32 away from capacitor dielectric 14.

In a second alternative of this embodiment, the conductor concentration remains constant throughout layer 32.

The conductor to organic ratio in the conductive-polymer can be varied over a wide range and the specific value selected depends on the specific application. The ratio may be constant vertically through layer 31 or 32, or may vary from a higher conductor concentration at the bottom to a lesser one at the top. Alternatively, the deposition process may deposit all conductor near dielectric material 14, and then introduce the organic to the deposition process to provide the conductive-polymer over the conductor. Alternatively, this may be reversed for an application that requires more conductivity at the top of the layer. Common electrode 30 may or may not be used underlying the conductive-polymer, depending on the application. Conducting electrode 12 may not be used, depending on the application, with its bias function performed by the conducting polymer.

The optical coatings described above arc deposited using the novel apparatus and processes which will be described with the aid of FIG. 6 and Table 2.

TABLE 2

| ID # | Description | Function |
|---|---|---|
| 33 | Mechanical vacuum pump | Achieves moderate vacuum to reduce initial load on cryopump 64 |
| 34 | Vacuum valve | Seals process chambers from roughing pump 45. |
| 35 | Cold trap | Condenses gaseous products to protect 45. |
| 36 | Orifice/pump flow regulating valve | Optimizes dwell time for deposition uniformity |
| 37 | Upper vacuum chamber | Deposition chamber for codeposition of conducting polymer on IR sensor array at a moderate vacuum. |
| 38 | Cooling water outlets |  |
| 39 | Lower vacuum chamber | Provides higher vacuum for electron beam gun 56. |
| 40 | Cooling water inlets |  |
| 41 | Gas inlet and control (optional) | Predepostion substrate shield. Admits inert gas such as nitrogen, argon or helium to maintain proper flow and pressure for deposition chamber 37 to keep organic from depositing on the substrate during initial stabilization. |
| 42 | Substrate holder | Provides water cooled, stable mounting for substrate. |
| 43 | Coolant source | Provides cooling for cold trap 35 (typically liquid nitrogen). |
| 44 | Shutter assembly | Externally actuated shutter exposes and shields substrate mounted on 42 to desired gaseous deposition species. |
| 45 | Mechanical vacuum pump | Achieves moderate vacuum to enable polymer flow. |
| 46 | E-gun driven electrical conductor material in vapor form | Mixes with polymer vapor for deposition on substrate. |
| 47 | Vacuum valve | Seals process chambers from roughing pump 33. |
| 48 | Post pyrolysis heater | Prevents undesired deposition. |
| 50 | Pyrolysis furnace | Converts organic dimer (vapor) into required state (monomer, then polymer) for forming a material bond with conductor(s) (typically run at 680–700° C. |
| 52 | Vaporizer | Converts liquid/solvent/solid state of organic dimer insulator to gaseous. |
| 54 | Loading door | Provides access to load 52. |
| 56 | Electron beam assembly | Provides components to vaporize conductor and control concentration by means of electronic controls and sensors. |

TABLE 2-continued

| ID # | Description | Function |
|---|---|---|
| 57 | Polymer generation | Creation of polymer (dimer to monomer to polymer). |
| 58 | Cold trap | Condenses vapor products harmful to 64. |
| 60 | Mechanical gate valve | Allows isolation of 64. |
| 64 | Cryopump | Achieves higher vacuum required for 39. |
| 66 | Housing for E-beam electronics, and for additional monitoring and controlling electronics for furnace control. | E-beam power supplies may be stored in a separate rack. |
| 68 | Housing for furnace/process control. | |
| 70 | Vacuum gauge | |
| 72 | Heated valve (optional) | Redirects polymer flow prior to opening the shutter (if used, typically redirects flow to duplicate setup of orifice 36, coolant source 43, cold trap 35, vacuum valve 34, and mechanical vacuum pump 45). |
| 74 | Baffle (2 each) | Provides for uniform flow in chamber 37. |
| 76 | Vacuum interlock | Safety precaution |

To achieve the proper IR absorption and eletrical conductivity simultaneously with a codeposited film, significantly better deposition control is generally required than that afforded by a standard vacuum metal deposition from a heated boat. Loeb, U.S. Pat. No. 3,301.707, discloses a deposition apparatus for the prior process, with a single vacuum chamber and a melt pool for evaporating the metal. The present invention uses two differentially pumped chambers 37 and 39, and conductor deposition is achieved by means of an electron gun 56 operating under vacuum produced by cryopump 64, thus providing film uniformity and deposition control.

Figure 6:
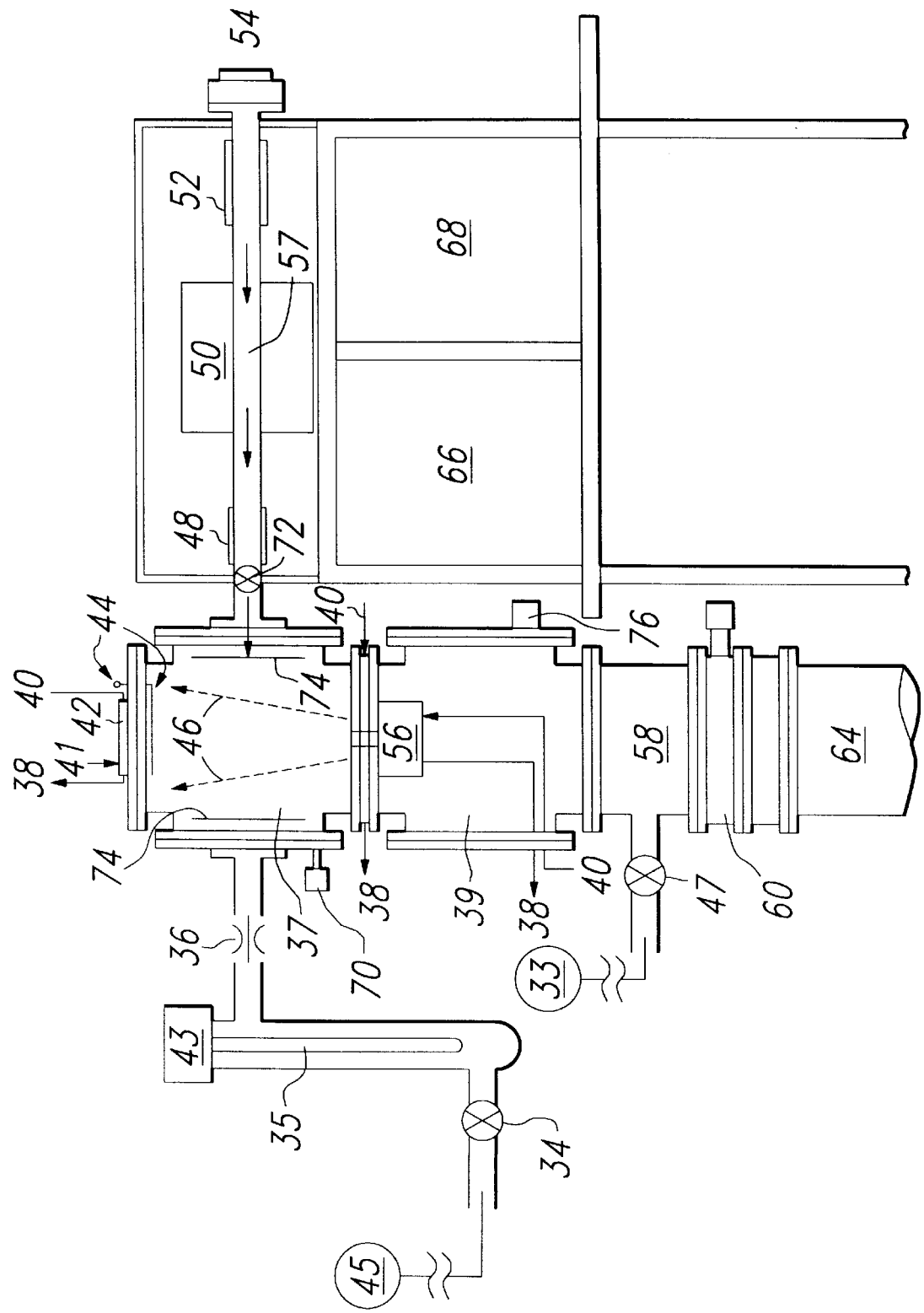
FIG. 6 illustrates the apparatus used to deposit a conductive-polymer on an IR sensing array.

The functions of the components of FIG. 6 are described in Table 2. In operation, the IR sensing array substrate (signal processing IC 24 of FIGS. 2–5) is first mounted to substrate holder 42 prior to pump down. Vaporizer 52 is loaded with parylene or another suitable organic polymer. The electron gun material holder in electron beam assembly 56 is loaded with lead or another suitable low-melting-point electrical conductor, or combination of conductors. The vacuum system is sealed cold traps 35 and 58 are stabilized, and roughing pumps 33 and 45 provide the initial pump down for their respective chambers 39 and 37. After chambers 37 and 39 are sufficiently low in pressure, cryopump 64 is actuated through valve 60 to provide the higher vacuum/lower pressure required for the E-gun chamber 39. With shutter 44 closed to protect the substrate, pump flow regulating valves 36, the E-gun rate from electron beam assembly 56, the pyrolysis decomposed parylene flow rate from pyrolysis furnace 50, and the inert gas bled in by inlet 41 are all adjusted and electronically controlled to maintain the required differential pressures between chambers 37 and 39. These pressures typically range from 40–80 $\mu$m for the process chamber 37 and $10^{31\ 4}$ to $\mathbf{10^{31\ 5}}$ Torr for the E-gun chamber 39. Baffles 74 provide for uniform flow through chamber 37.

After all flows have stabilized, shutter 44 is actuated to expose the substrate mounted on holder 42 for deposition of the combined lead vapor 46 and parylene vapor 57 for the length of time needed for the desired material thickness. Concurrently, cooling water through inlets 40 and outlets 38 maintain all surfaces at preset temperatures.

Subsequently, shutter 44 closes and flow is terminated to complete the deposition of the robust conductive-polymer optical coating. The vacuum system may then be raised in pressure and opened to the atmosphere in a conventional manner to remove the processed substrate. Optical measurements performed on this conductive-polymer have shown a high IR absorption factor of greater than 90%.

Although the suhistratc holder is referred to as holding a single sibstrate were in the process chamber, a plurality of substrates may be coated at the same time. In addition, although lead is used as the low-melting-point electrical conductor component of the conductive-polymer, other metals or semiconductors, alone or in various combinations, with low-melting-point temperatures may be used.

There also exist various compositions of parylene "parylene" is the generic name for polymers based on poly-para-xylylene) that could be used in this application. The specific vacuum, mechanical, heating, electronic and structural components and parameters of the deposition apparatus of FIG. 6 have a wide latitude of selection.

After parylene deposition is completed, the substrate can be placed in a plasma reactor and reactively etched with $CF_4$ and oxygen to achieve greater IR absorption. Typically, the substrate is ashed for less than five minutes, and preferably for about one to two minutes. This subsequent ashing step may or may not be used depending on the application. Proper electronic control of the deposition process may produce a coating with an IR absorption percentage of greater than 90%, even without the ashing step. Alternatively, other organic etches such as other fluorine compounds or oxygen alone could be used as the gases in the plasma etch step.

Figure 7:
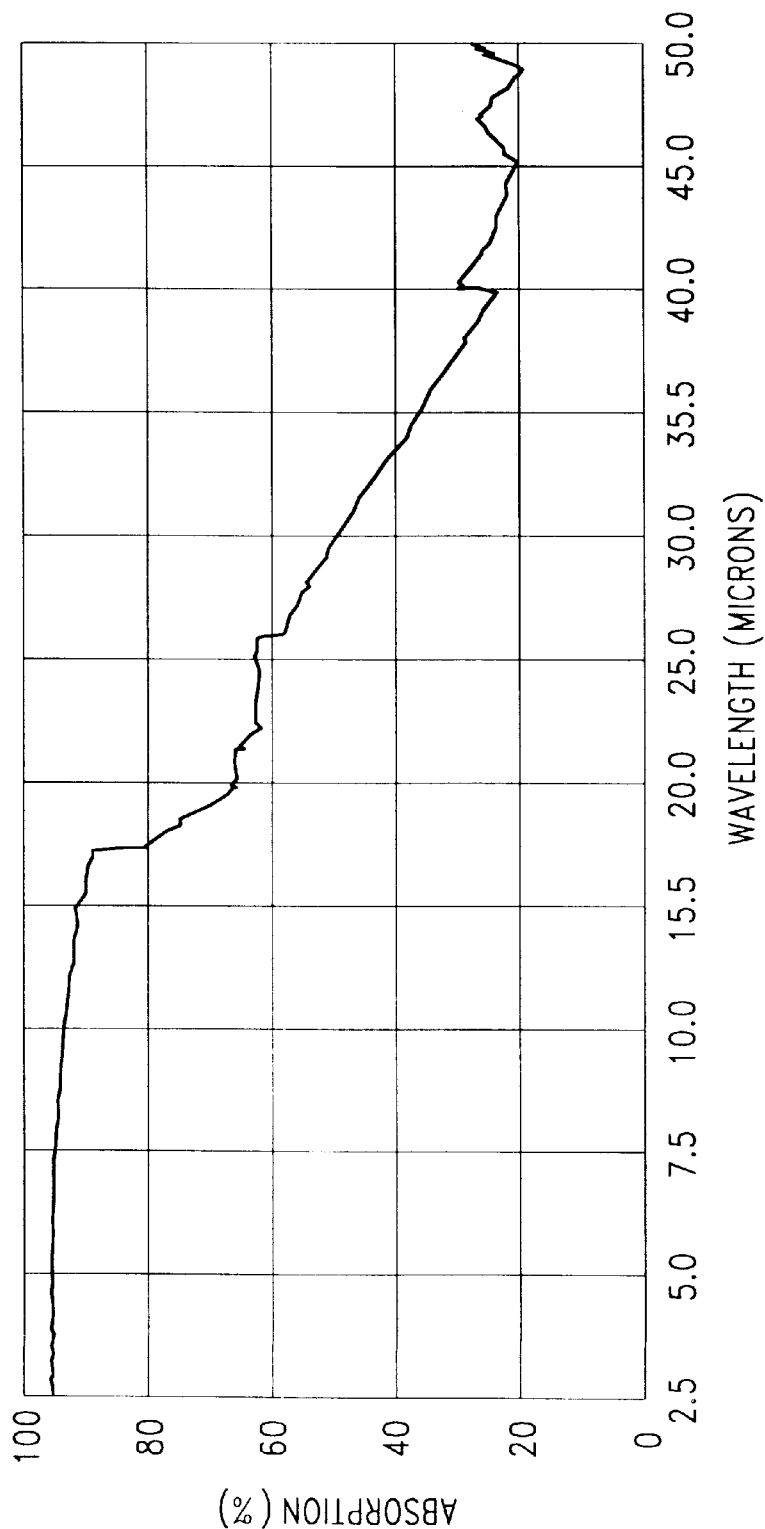
FIG. 7 shows a graph of absorption versus wavelength for an actual sample of the coating produced with the apparatus of FIG. 6.

FIG. 7 is a graph showing percent of incident radiation absorption versus wavelength for a conductive-polymer coating which was plasma ashed after being formed with the above-described apparatus. As the graph illustrates, the layer has greater than 90% absorption for wavelengths in the 3–14 $\mu$m range. In addition, the absorption is fairly uniform over this infrared wavelength region.

Figure 8:
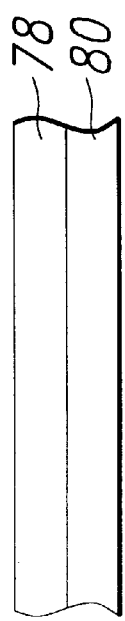
FIG. 8 illustrates a vertical cross section of a conductive-polymer optical coating overlaying an infrared-sensitive layer.

This conductive-polymer coating is useful for many applications in which IR radiation absorption is required. FIG. 8 illustrates a structure in which conductive-polymer coating 78 is applied to IR sensitive layer 80. This combination or its equivalent may be used, for example, in solar collectors, cooled IR detectors, uncooled IR detectors, IR sensitive capacitors, or IR sensitive bolometers. Conductive-polymer coating 78 absorbs over 90% of the incoming IR radiation and transfers it to underlying IR sensitive layer 80. The increase in IR absorption significantly increases the performance over that of a structure without the conductive-polymer coating.

Although the invention is shown as applied to uncooled IR sensor arrays. the conductive-polymer optical coating can be used in any application requiring a 3 –14 $\mu$m IR absorptive layer, such as in solar collectors, or cooled IR sensor applications (e.g. 3–5 $\mu$m). The conductive-polymer coating is generally useful for any type of underlying infrared sensor. For example, the underlying sensor may function as the dielectric in a capacitor, or as a resistive element in a bolometer structure. In addition, although the electrically conducting material vapor was described as being formed with an electron beam, other processes capable of forming the vapor may be used, such as chemical vapor deposition.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An infrared detection system, comprising:
    an integrated circuit substrate which includes a plurality of mesas, and includes a via connection on an upper portion of each of said mesas;
    a plurality of backside electrical contacts each bonded to a respective one of said via connections;
    a plurality of infrared-sensitive pixels each overlying a respective one of said electrical contacts; and
    a conductive-polymer optical coating overlying and electrically coupling said pixels, wherein said conductive-polymer coating is a single layer having a composition which is electrically conductive and which also has an infrared radiation absorption percentage of greater than about 90%.

2. The infrared detection system of claim 1, wherein said conductive-polymer coating includes an electrically insulating organic polymer and a low-melting-point electrical conductor.

3. The infrared detection system of claim 2, wherein said electrical conductor includes a metal.

4. The infrared detection system of claim 2, wherein said electrical conductor includes a semiconductor.

5. The infrared detection system of claim 2, wherein said electrical conductor is selected from the group consisting of lead, tin, indium, cadmium, bismuth, antimony, magnesium, lithium, europium, strontium, selenium, samarium, polonium, zinc, thallium, tellurium, germanium telluride, cadmium telluride, cadmium tin, cadmium zinc, germanium, and combinations thereof.

6. The infrared detection system of claim 2, wherein said electrically insulating organic polymer includes parylene.

7. The infrared detection system of claim 6, wherein said parylene is selected from the group consisting of poly(p-xylylene), poly-(chloro-p-xylylene), 2-methyl-p-xylylene, 2-ethyl-p-xylylene, 2-chloro-p-xylylene, 2-acetyl-p-xylylene, 2-cyano-p-xylylene, 2-bromo-p-xylylene, dichloro-p-xylylene, and combinations thereof.

8. The infrared detection system of claim 1, wherein said optical coating is elevated.

9. The infrared detection system of claim 1, further comprising a common electrode layer disposed between said pixels and said optical coating.

10. The infrared detection system of claim 1, further comprising a plurality of common electrodes disposed between said pixels and said optical coating.

11. The infrared detection system of claim 1, wherein said pixels comprise a perovskite.

12. The infrared detection system of claim 1, wherein said conductive-polymer coating includes a co-deposited electrically insulating organic polymer and low-melting-point electrical conductor.

13. The infrared detection system of claim 1, wherein a side of said coating opposite from said substrate is a surface which has been ashed.

14. An infrared-sensitive structure, comprising:
    an infrared-sensitive material layer;
    a conductive-polymer coating overlying said infrared-sensitive material layer, wherein said conductive-polymer coating is a single layer having a composition which is electrically conductive and which also has an infrared radiation absorption percentage of greater than about 90%.

15. The infrared-sensitive structure of claim 14, wherein said conductive-polymer coating comprises an electrically insulating organic polymer and a low-melting-point electrical conductor.

16. The infrared-sensitive structure of claim 15, wherein said electrical conductor includes a metal.

17. The infrared-sensitive structure of claim 15, wherein said electrical conductor includes a semiconductor.

18. The infrared-sensitive structure of claim 15, wherein said electrical conductor is selected from the group consisting of lead, tin, indium, cadmium, bismuth, antimony, magnesium, lithium, europium, strontium, selenium, samarium, polonium, zinc, thallium, tellurium, germanium telluride, cadmium telluride, cadmium tin, cadmium zinc, germanium, and combinations thereof.

19. The infrared-sensitive structure of claim 15, wherein said electrically insulating organic polymer includes parylene.

20. The infrared-sensitive structure of claim 19, wherein said parylene is selected from the group consisting of poly(p-xylylene), poly-(chloro-p-xylylene), 2-methyl-p-xylylene, 2-ethyl-p-xylylene, 2-chloro-p-xylylene, 2-acetyl-p-xylylene, 2-cyano-p-xylylene, 2-bromo-p-xylylene, dichloro-p-xylylene, and combinations thereof.

21. The infrared-sensitive structure of claim 14, wherein said structure is a bolometer.

22. The infrared-sensitive structure of claim 14, wherein said structure is a solar collector.

23. The infrared-sensitive structure of claim 14, wherein said is an infrared detector.

24. The infrared-sensitive structure of claim 14, wherein said conductive-polymer coating includes a co-deposited electrically insulating organic polymer and low-melting-point electrical conductor.

25. The infrared-sensitive structure of claim 14, wherein a side of said coating opposite from said infrared-sensitive material layer is a surface which has been ashed.

* * * * *

UNITED STATES PATENT AND TRADEMARK OFFICE
CERTIFICATE OF CORRECTION

PATENT NO. : 6,080,987
DATED : June 27, 2000
INVENTOR(S) : Belcher et al.

It is certified that error appears in the above-identified patent and that said Letters Patent is hereby corrected as shown below:

Col. 1, line 47, delete "mlecasure", and insert --measure--.
Col. 2, line 26, after "limited", delete "thermal" insert --thermal--.
Col. 3, line 8, after "shutter", delete --to--.
Col. 3, line 8, after "assembly", delete"." and insert --,--.
Col. 3, line 9, after "is", delete "cipable" and insert --capable--.
Col. 3, line 12, after "vacuum", delete "chammber", and insert --chamber--.
Col. 3, line 12, after "layer", delete ":", and insert --;--.
Col. 4, line 34, after "optical", delete "casting", and insert --coating--.
Col. 4, line 35, after "absorption", insert --.--.
Col. 4, line 37, after "in", delete "additioin", and insert --addition--.
Col. 5, line 23, delete "tanate", and insert --titanate--.
Col. 5, line 43, after "hybrid", insert --similar--.
Col. 5, line 55, after "array", delete "it", and insert --if--.
Col. 5, line 56, after "is", delete "male", and insert --made--.
Col. 5, line 58, after "alternate", delete "emmbodiment", and insert --embodiment--.
Col. 6, line 20, after "above", delete "arc", and insert --are--.
Col.7, line 31, after "No.", delete "3,301.707", and insert --3,301,707--.
Col. 7, line 46, after "sealed", insert --,--.
Col. 7, line 59, after "and", delete "$10^{314}$ to $10^{315}$", and insert --$10^{-4}$ to $10^{-5}$--.

UNITED STATES PATENT AND TRADEMARK OFFICE
CERTIFICATE OF CORRECTION

PATENT NO. : 6,080,987
DATED : June 27, 2000
INVENTOR(S) : Belcher et al.

It is certified that error appears in the above-identified patent and that said Letters Patent is hereby corrected as shown below:

Col. 8, line 8, after "the", delete "suhistratc", and insert --substrate--.
Col. 8, line 9, after "single", delete "sibstrate", and insert --substrate--.
Col. 8, line 16, insert --(--.

Signed and Sealed this

Eighth Day of May, 2001

Attest:

NICHOLAS P. GODICI

*Attesting Officer*   *Acting Director of the United States Patent and Trademark Office*